United States Patent
Naem

(10) Patent No.: US 6,468,871 B1
(45) Date of Patent: Oct. 22, 2002

(54) METHOD OF FORMING BIPOLAR TRANSISTOR SALICIDED EMITTER USING SELECTIVE LASER ANNEALING

(75) Inventor: Abdalla Naem, Overijse (BE)

(73) Assignee: National Semiconductor Corporation, Santa Clara, CA (US)

( * ) Notice: Subject to any disclaimer, the term of this patent is extended or adjusted under 35 U.S.C. 154(b) by 62 days.

(21) Appl. No.: 09/816,824

(22) Filed: Mar. 23, 2001

Related U.S. Application Data

(63) Continuation-in-part of application No. 09/708,261, filed on Nov. 7, 2000.

(51) Int. Cl.⁷ .......................................... H01L 21/331
(52) U.S. Cl. .................................. 438/378; 438/365
(58) Field of Search ............................... 438/320, 378, 438/364, 365, 346, 760, 646

(56) References Cited

U.S. PATENT DOCUMENTS

| | | | | |
|---|---|---|---|---|
| 4,407,060 A | * | 10/1983 | Sakurai | 438/345 |
| 4,651,410 A | * | 3/1987 | Feygenson | 438/322 |
| 5,933,720 A | * | 8/1999 | Yokoyama et al. | 438/202 |

\* cited by examiner

Primary Examiner—John F. Niebling
Assistant Examiner—Christopher Lattin

(74) Attorney, Agent, or Firm—Stallman & Pollock LLP

(57) ABSTRACT

A method is provided for forming a uniformly salicided single crystal silicon emitter structure in a semiconductor integrated circuit bipolar transistor structure. The bipolar transistor structure includes a collector region that has a first conductivity type formed in a semiconductor substrate and a base region having a second conductivity type, opposite the first conductivity type, formed in the collector region. A layer of dielectric material is formed on the surface of the base region. An emitter window is opened in the layer of dielectric material to expose a surface area of the base region. A layer of polysilicon is then formed over the layer of dielectric material and extending into the emitter window such that at least a portion of the layer of polysilicon is in contact with the surface area of the base region. Dopant of the first conductivity type is then introduced into the layer of polysilicon. A region of anti-reflective coating (ARC) material is formed on the layer of polysilicon over the emitter window opening such that portions of the layer of polysilicon are exposed. Sufficient laser energy is then applied to the structure resulting from the foregoing steps to cause the polysilicon underlying the region of anti-reflective coating material to flow and recrystallize. The region of anti-reflective coating material is then utilized as a hard mask to remove unwanted regions of polysilicon, thereby defining a single crystal silicon emitter region under the ARC material and extending into the emitter window opening and in interfacial contact with the surface area of the base region. The ARC material is then removed and a layer of refractory metal silicide is formed on the recrystallized polysilicon emitter region.

5 Claims, 1 Drawing Sheet

METHOD OF FORMING BIPOLAR TRANSISTOR SALICIDED EMITTER USING SELECTIVE LASER ANNEALING

RELATED APPLICATION

This application is a Continuation-In-Part of co-pending and commonly assigned application Ser. No. 09/708,261, filed Nov. 7, 2000, by Abdalla Naem, titled "Uniform Emitter Formation Using Selective Laser Recrystallization."

BACKGROUND OF THE INVENTION

1. Field of the Invention

The present invention relates to the fabrication of semiconductor integrated circuit structures and, in particular, to the utilization of selective laser annealing to form a uniformly salicided crystalline silicon emitter in a bipolar transistor structure.

2. Discussion of the Related Art

FIG. 1 illustrates several problems resulting from the formation of the emitters of bipolar transistors utilizing conventional integrated circuit fabrication techniques. First, variations in the vertical thickness of the emitter polysilicon film in the emitter window cause non-uniform doping of the emitter poly; this results in a non-uniform doping profile in the emitter region when ion implantation is used, which causes process non-uniformity and, therefore, device performance variations. Second, incomplete filling of the emitter window with emitter polysilicon creates voids, resulting in a non-uniform emitter/base contact interface due to emitter narrowing; this leads to a smaller and non-reproducible emitter/base junction interfacial area. Third, insufficient dopant activation using conventional annealing techniques results in lower current gain in the bipolar device.

SUMMARY OF THE INVENTION

The present invention utilizes selective laser recrystallization of emitter polysilicon for the formation of uniform emitter/base junctions and highly uniformly doped emitter electrodes using conventional ion implant doping and polysilicon deposition techniques. The laser recrystallization step converts the polysilicon into single crystal silicon which facilitates formation of a uniform refractory metal silicide on top of the emitter. A uniform silicide layer reduces emitter resistance and, therefore, enhances the bipolar transistor performance.

Thus, the present invention is directed to a method of forming a salicided crystalline silicon emitter structure in a semiconductor integrated circuit bipolar transistor. The bipolar transistor structure includes a collector region of a first conductivity type formed in a semiconductor substrate and a base region of a second conductivity type, opposite the first conductivity type, formed in the collector region. A layer of dielectric material is formed on the surface of the base region. An emitter window is then opened in the dielectric material to expose a surface area of the base region. Polysilicon is then formed over the layer of dielectric material and extending into the emitter window such that at least a portion of the polysilicon layer is in contact with the surface area of the base region. Dopant of the first conductivity type is then introduced into the polysilicon. A region of anti-reflective coating (ARC) material, preferably silicon nitride, is formed on the doped polysilicon layer over the emitter window opening such that portions of the polysilicon layer are exposed. Sufficient laser energy is then applied to the structure resulting from the foregoing steps to cause the polysilicon underlying the region of ARC material to melt and flow and recrystallize. Unwanted portions of the laser annealed polysilicon are then removed by wet etching or dry etching, in the presence of the ARC material, which serves as a hard mask. Thus, the ARC material is used to define a single crystal silicon emitter region that extends into the emitter window opening and is in interfacial contact with the surface area of the base region. The ARC material is then removed and conventional techniques are utilized to form a layer of refractory metal silicide on the top surface of the single crystal silicon emitter.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 1:
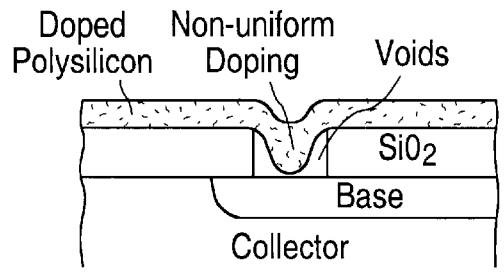
FIG. 1 is a partial cross-section view illustrating a conventional polysilicon emitter structure.
Figure 2:
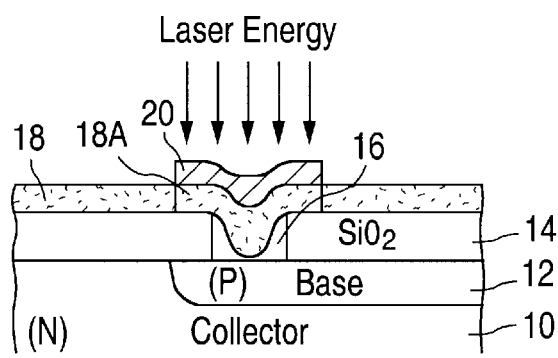
FIG. 2. is a partial cross-section view illustrating steps in a method for forming a polysilicon emitter structure in accordance with the concepts of the present invention.

FIG. 2 shows structural elements of a conventional npn bipolar transistor structure, including a N-type collector region 10 formed in a crystalline silicon substrate and a P-type base region 12 formed in the N-type collector region 10. A layer 14 of dielectric material, preferably silicon dioxide, is formed on the surface of the P-type base region 12. An emitter window opening 16 is formed in the layer 14 of dielectric material using conventional photolithographic/etching techniques to expose a surface area of the base region 12. A layer 18 of polysilicon is formed over the layer 14 of dielectric material and extending into the emitter window opening 16 such that at least a portion of the polysilicon layer 18 is in contact with the surface area of the base region 12. N-type dopant, typically arsenic or phosphorous, is then introduced into the polysilicon layer 18, preferably by ion implantation. The polysilicon is typically about 2000 Angstroms thick and has a dopant concentration of about 2E20 per cubic centimeter.

Next, a layer of anti-reflective coating (ARC) material, for example silicon nitride ($Si_3N_4$), is formed on the layer 18 of polysilicon and patterned using the emitter photolithographic mask. Unwanted ARC material is then removed by etching to form a region 20 of ARC material on the polysilicon layer 18 and over the emitter window opening 16 in the layer 14 of dielectric material such that portions of the polysilicon layer 18 are exposed. This limits the ARC region 20 to the desired emitter width where it is required. If the polysilicon layer 18 is as described above, then the ARC material 20 can be about 600 Angstroms of LPCVD silicon nitride that is deposited on the implanted polysilicon 18 at about 700 degrees Centigrade.

Next, sufficient laser energy is applied to the foregoing structure, for example, using a CW Argon laser system, to cause the polysilicon 18a underlying the region 20 of ARC material to melt, flow and recrystallize to form single crystal silicon under the ARC region 20 only. Unwanted polysilicon is then removed by wet etching or dry etching, in the presence of the ARC region 20, which acts as a hard mask.

Silicon nitride is transparent at the Argon laser wavelength (500 nm) and its reflective index is less than that of polysilicon and very close to the ideal value for minimum reflection. These optical properties of silicon nitride ensure maximum absorption of the laser energy that is required to melt the underlying polysilicon 18a.

The amount of radiation energy absorbed by the polysilicon 18a beneath the silicon nitride region 20 is also critically dependent on the thickness of the nitride 20. Therefore, the choice of about 600 Angstroms thick nitride ARC layer is crucial for successful selective laser annealing. Of course, those skilled in the art will appreciate that the thickness of the ARC material 20 will depend on the nature and thickness of the underlying polysilicon 18a.

As mentioned above, preferably, the laser annealing is performed using a continuous wave (CW) Argon laser set to produce a beam diameter of about 50 um, an output power of about 11 watts, and a scanning speed of about 100 cmls.

The application of a selective laser annealing technique allows the heating up of only the desired emitter area, without effecting adjacent (e.g. CMOS) devices, making this approach highly desirable for BiCMOS process applications. That is, only that doped emitter polysilicon 18a that is covered with ARC material (e.g. $Si_3N_4$) 20 will heat up to the desired local temperature, which should be greater than about 1200° C.

As mentioned above, selective heating of the doped polysilicon can be achieved by depositing silicon nitride film on top of the emitter poly, which significantly reduces the laser beam reflection and allows for local absorption of the laser energy in the emitter polysilicon region 18a. Melting the emitter polysilicon 18a in this manner converts the emitter electrode to single crystal material, or large grains.

Figure 3:
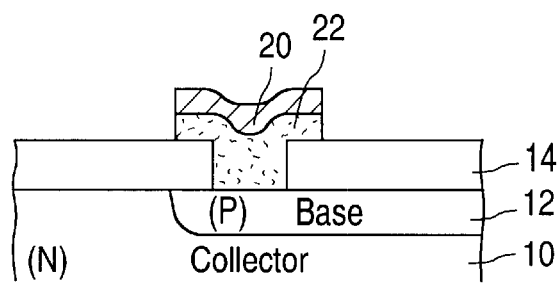
FIG. 3 is a partial cross-section view illustrating a recrystallized silicon emitter structure formed in accordance with the concepts of the present invention.
Figure 4:
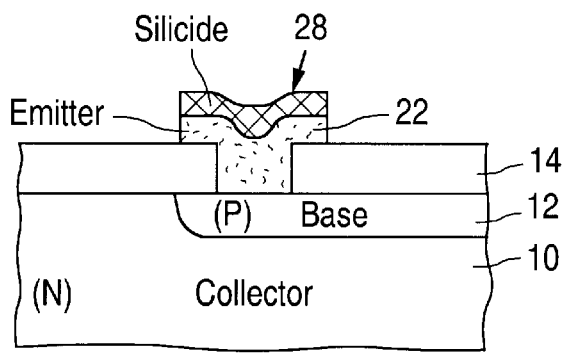
FIG. 4 is a partial cross-section view illustrating a salicided single crystal silicon emitter structure formed in accordance with the concepts of the present invention.

Melting the emitter polysilicon as discussed above results in the filling of the emitter window, resulting in a uniform emitter/base junction along the emitter width, as shown in FIG. 3. Melting the emitter polysilicon also allows for uniform dopant distribution throughout the emitter thickness down to the emitter/base junction, thereby eliminating the plugging effect discussed above. Laser annealing also results in uniform and a high degree of dopant activation due to the high localized temperature (1200° C.) caused by the anti-reflective coating.

As mentioned above, removal of unwanted polysilicon takes place using the ARC region 20 as a hard mask. Thus, there is no need for an additional masking step as is usually required by conventional techniques. Since the polysilicon under the ARC region 20 is recrystallized into single crystal silicon, it acts as an etch stop, causing the undercut during the polysilicon removal step to be minimal.

As shown in FIG. 3, following removal of unwanted polysilicon, the region 20 of ARC material is removed, preferably by dry etching. The layer of annealed, recrystallized polysilicon 18a defines an N-type single crystal silicon emitter region 22 that extends into the emitter window opening 16 in the layer 14 of dielectric material and in interfacial contact with the surface area of the base region 12.

Following removal of the ARC region 20, a uniform salicide film is formed on top of the single crystal silicon emitter region utilizing conventional techniques. According to one such technique, refractory metal, for example 150 A of cobalt, is deposited followed by the deposition of a barrier layer, for example titanium nitride film. The structure is then annealed using rapid thermal anneal (RTA) techniques in a nitrogen ambient. As a result of this RTA step, the cobalt in contact with the recrystallized silicon 18a is converted into an initial phase of salicide material. The titanium nitride and unwanted cobalt are then removed by wet etching. This patterning step does not require a mask due to the high etch selectivity between the refractory metal and the salicide film. A second RTA step is then performed to form the final stable, low resistance salicide film 28.

Those skilled in the art will appreciate that, although the embodiment of the invention described above is directed to a npn bipolar transistor structure, the concepts of the invention are equally applicable to pnp bipolar transistor structures.

Given the above detailed description of the invention and the embodiments of the invention described therein, it is intended that the following claims define the scope of the invention and that structures and methods within the scope of these claims and their equivalents be covered thereby.

What is claimed is:

1. A method of forming an emitter structure in a semiconductor integrated circuit bipolar transistor structure, the bipolar transistor structure including a collector region having a first conductivity type formed in a semiconductor substrate and a base region having a second conductivity type, opposite the first conductivity type, formed in the collector region, the method comprising:

forming a layer of dielectric material on a surface of the base region;

forming an emitter window opening in the layer of dielectric material to expose a surface area of the base region;

forming a layer of polysilicon over the layer of dielectric material and extending into the emitter window opening such that at least a portion of the layer of polysilicon is in contact with the surface area of the base region;

introducing dopant of the first conductivity type into the layer of polysilicon;

forming a region of anti-reflective coating (ARC) material on the layer of polysilicon and over the emitter window opening in the layer of dielectric material such that portions of the layer of polysilicon are exposed;

applying sufficient annealing laser energy to the structure resulting form the foregoing steps to cause the polysilicon underlying the region of ARC material to flow to form recrystallized silicon;

removing unwanted polysilicon while leaving recrystallized silicon under the region of ARC material;

removing the ARC material to define a single crystal silicon emitter region that extends into the emitter window opening in the layer of dielectric material and in interfacial contact with the surface area of the base region; and forming a layer of refractory metal silicide on a top surface of the single crystal silicon emitter region.

2. A method as in claim 1, and wherein the bipolar transistor structure is an npn bipolar transistor structure.

3. A method as in claim 1, and wherein the dielectric material comprises silicon dioxide.

4. A method as in claim 1, and wherein the anti-reflective coating material comprises silicon nitride.

5. A method as in claim 1, and wherein the laser energy is applied utilizing a continuous wave Argon laser system.

* * * * *